United States Patent
Iwasaki et al.

(10) Patent No.: US 8,981,531 B2
(45) Date of Patent: Mar. 17, 2015

(54) COMPOSITE WAFER AND METHOD FOR MANUFACTURING THE SAME

(71) Applicant: NGK Insulators, Ltd., Aichi (JP)

(72) Inventors: Yasunori Iwasaki, Kitanagoya (JP); Akiyoshi Ide, Kasugai (JP); Yuji Hori, Owariasahi (JP); Tomoyoshi Tai, Inazawa (JP); Sugio Miyazawa, Kasugai (JP)

(73) Assignee: NGK Insulators, Ltd., Aichi (JP)

( * ) Notice: Subject to any disclaimer, the term of this patent is extended or adjusted under 35 U.S.C. 154(b) by 0 days.

(21) Appl. No.: 14/164,915

(22) Filed: Jan. 27, 2014

(65) Prior Publication Data

US 2014/0191373 A1 Jul. 10, 2014

Related U.S. Application Data

(63) Continuation of application No. PCT/JP2013/069284, filed on Jul. 16, 2013.

(60) Provisional application No. 61/672,807, filed on Jul. 18, 2012.

(51) Int. Cl.
*H01L 29/06* (2006.01)
*H01L 21/762* (2006.01)

(52) U.S. Cl.
CPC .............. *H01L 29/06* (2013.01); *H01L 21/762* (2013.01); *H01L 21/76251* (2013.01)
USPC .......................... 257/618; 438/455; 438/459

(58) Field of Classification Search
USPC ................... 257/618; 438/455, 459
See application file for complete search history.

(56) References Cited

U.S. PATENT DOCUMENTS

| 8,551,862 | B2* | 10/2013 | Akiyama et al. | 438/458 |
| 8,697,541 | B1* | 4/2014 | Kumar | 438/455 |
| 8,765,576 | B2* | 7/2014 | Akiyama et al. | 438/455 |

(Continued)

FOREIGN PATENT DOCUMENTS

| JP | 2007-300081 | 11/2007 |
| JP | 2010-161355 | 7/2010 |

(Continued)

OTHER PUBLICATIONS

International Search Report for PCT Patent App. No. PCT/JP2013/069284 (Oct. 8, 2013).
Written Opinion for PCT Patent App. No. PCT/JP2013/069284 (Oct. 8, 2013) with English language translation and Translator's Verification.

(Continued)

*Primary Examiner* — Earl Taylor
(74) *Attorney, Agent, or Firm* — Cermak Nakajima & McGowan LLP; Tomoko Nakajima

(57) ABSTRACT

A composite wafer 10 includes a supporting substrate 12 and a semiconductor substrate 14 which are bonded to each other by direct bonding. The supporting substrate 12 is a translucent alumina substrate with an alumina purity of 99% or more. The linear transmittance of the supporting substrate 12 at the visible light range is 40% or less. Furthermore, the total light transmittance from the front at a wavelength of 200 to 250 nm of the supporting substrate 12 is 60% or more. The average crystal grain size of the supporting substrate 12 is 10 to 35 μm. The semiconductor substrate 14 is a single crystal silicon substrate. Such a composite wafer 10 has insulation performance and thermal conduction comparable to those of a SOS wafer, can be manufactured at low cost, and can be easily made to have a large diameter.

9 Claims, 5 Drawing Sheets

(56) References Cited

U.S. PATENT DOCUMENTS

| | | | |
|---|---|---|---|
| 2011/0227068 A1* | 9/2011 | Akiyama | 257/43 |
| 2013/0294038 A1* | 11/2013 | Landru et al. | 361/748 |
| 2014/0191373 A1* | 7/2014 | Iwasaki et al. | 257/618 |

FOREIGN PATENT DOCUMENTS

| | | |
|---|---|---|
| JP | 2010-161359 | 7/2010 |
| JP | 2010-278342 | 12/2010 |
| JP | 2011-029594 | 2/2011 |

OTHER PUBLICATIONS

Supplementary European Search Report for European Patent App. No. 13820306. 2 (Jan. 12, 2015).

Takato, H., et al., "Thin-Film Silicon Solar Cells Using an Adhesive Bonding Technique," IEEE Transactions on Electron Devices, vol. 48, No. 9, Sep. 1, 2001, pp. 2090-2094.

Krell et al., "Physics and Technology of transparent ceramic armor: Sintered A1203 vs cubic materials," Nanomaterials Technology for military vehicle structural applications, Meeting Proceedings RTO-MP-AVT-122, 14, Aug. 1, 2006, pp. 14-01-14-10.

* cited by examiner (a)

(b)

(c)

Cavity

Cavity

COMPOSITE WAFER AND METHOD FOR MANUFACTURING THE SAME

TECHNICAL FIELD

The present invention relates to a composite wafer and a method for manufacturing the same.

BACKGROUND ART

As antenna switches used for mobile phones, in order to fulfill the multi-mode, multi-band demands, pHEMT switches using GaAs have been used from the viewpoint of linearity and strain suppression. However, GaAs platforms have a drawback in that power consumption cannot be decreased because of current leakage to substrates, and the like. Furthermore, a switching device needs to separately have decoder circuits made of Si provided outside thereof. Therefore, when a GaAs platform is used, it is not possible to integrate the circuits. Consequently, there is a limit to the reduction in size and cost.

In recent years, in order to solve the problem described above, there has been provided a SOI (Silicon on Insulator) technique (for example, refer to Patent Literature 1). A SOI wafer is known in which a $SiO_2$ layer is formed on the upper portion of a Si layer, and another Si layer is bonded thereon as a functional layer. Furthermore, a SOI wafer is known in which an alumina substrate and a silicon substrate are bonded to each other (for example, Patent Literature 2).

CITATION LIST

Patent Literature

PTL 1: JP 2011-29595 A
PTL 2: JP 2010-278342 A

SUMMARY OF INVENTION

Technical Problem

However, in the SOI wafer of Patent Literature 1, since the thickness of the $SiO_2$ layer is about 1 μm or less, the insulation performance of the whole SOI wafer is limited to a certain degree. Furthermore, since the thermal conductivity of $SiO_2$ is only about 1.5 W/mk, the SOI wafer has a property of poorly dissipating heat generated in the CMOS circuit layer (Si layer). Thus, the SOI wafer of Patent Literature 1 has a problem that it is insufficient in terms of insulation performance and thermal conduction.

Furthermore, in the SOI wafer of Patent Literature 2, when application to a high frequency device which requires low strain and low loss is taken into consideration, a commonly used alumina substrate is not suitable because of its excessively large dielectric loss tangent (tan δ). In contrast, a polycrystalline translucent alumina substrate has a small tan δ, and is thus suitable for a high frequency device. However, when a photoresist film on silicon is irradiated with a laser beam through a mask, the laser beam is reflected at the bonding interface between the translucent alumina substrate and the silicon substrate and from the inside of the translucent alumina substrate toward the back side of the photoresist film, resulting in a decrease in the accuracy of patterning, which is a problem.

The present invention has been achieved in order to solve such problems, and it is an object of the present invention to provide a composite wafer which is made to be suitable for a high frequency device while securing good insulation performance and thermal conduction, and in which accuracy of patterning by photolithography is enhanced.

Solution to Problem

A composite wafer according to the present invention comprises a supporting substrate and a semiconductor substrate which are bonded to each other by direct bonding, wherein the supporting substrate is composed of a polycrystalline translucent ceramic; the semiconductor substrate is composed of silicon; and in the supporting substrate, the total light transmittance from the front at a wavelength of 200 to 250 nm is higher than the total light transmittance from the front at a wavelength of 555 nm.

In the composite wafer, since a polycrystalline translucent ceramic is used for the supporting substrate, good insulation performance (e.g., $>10^{14}$ Ωm) and thermal conduction (e.g., $>30$ W/mk) can be secured. Furthermore, since the translucent ceramic supporting substrate is used, the tan δ is small, which is suitable for a high frequency device. Furthermore, accuracy of patterning by photolithography is improved. That is, in the case where, after a photoresist film is formed on the surface of the semiconductor substrate, the photoresist film is exposed using UV with a wavelength of 200 to 250 nm (for example, using a KrF laser with a wavelength of 248 nm), high-accuracy patterning can be performed. UV with a wavelength of 200 to 250 nm passes through the semiconductor substrate. In the supporting substrate, the total light transmittance from the front at a wavelength of 200 to 250 nm is higher than the total light transmittance from the front at a wavelength of 555 nm. Therefore, the amount of light scattered and reflected at the interface between the supporting substrate and the semiconductor substrate and from the inside of the supporting substrate backward, i.e., toward the semiconductor substrate side, is small, and the photoresist film on the supporting substrate is scarcely exposed from the back side thereof. Consequently, high-accuracy patterning can be performed. Incidentally, since the resolution of an exposure apparatus is defined by k×λ/NA (k: coefficient, λ: a wavelength of a light source, NA: a numerical aperture of a projection lens), a fine pattern can be formed by performing exposure with a short wavelength.

Furthermore, it is preferable to use a high-purity product with a purity of 99% or more as the polycrystalline translucent ceramic. The reason for this is to prevent degradation in thermal conduction/insulation performance due to impurities.

In the composite wafer according to the present invention, preferably, the total light transmittance from the front at a wavelength of 200 to 250 nm of the supporting substrate is 80% or more. In this case, the accuracy of patterning by photolithography is further improved.

In the composite wafer according to the present invention, preferably, the linear transmittance at a wavelength of 200 to 750 nm of the supporting substrate is 20% or less. In this case, since the supporting substrate has a high total light transmittance from the front and a low linear transmittance, scattering of light increases inside the supporting substrate, and the influence due to reflection at the surface of a stage on which the composite wafer is placed is decreased. Furthermore, in the semiconductor fabrication process, wafers are automatically transported, and during this process, image recognition is performed using visible light. In order to for a wafer to be subjected to image recognition, a property of not transmitting visible light is required. When the linear transmittance at a wavelength of 200 to 750 nm of the supporting substrate is 20% or less, image recognition of the composite wafer can be performed reliably.

In the composite wafer according to the present invention, preferably, the average crystal grain size of the supporting substrate is 10 to 50 μm. In this case, since the average crystal grain size is small, light is likely to be scattered in the exposure step of the photolithographic technique. When the average crystal grain size is less than 10 μm, the number of defects that are unevenly distributed inside the material and grain boundaries increases, which is undesirable. On the other hand, when the average crystal grain size is more than 50 μm, fractures are likely to occur in the substrate because of internal stress, which is undesirable.

In the composite wafer according to the present invention, the supporting substrate may be provided with a cavity. The supporting substrate is obtained by forming materials for a translucent ceramic into a predetermined shape, followed by firing. Accordingly, when a supporting substrate provided with a cavity is formed, a mold by which a formed body provided with a cavity can be obtained is used. Consequently, masking and etching steps are not required. For example, in the case where a silicon substrate, not a translucent ceramic substrate, is used as the supporting substrate, a series of steps are required to form a cavity in the silicon substrate, which include, first, covering one surface (a surface opposite the surface that is to be bonded to a semiconductor substrate) of the silicon substrate with a mask, exposing/developing the mask, and then etching portions not covered with the mask. The shape of the cavity is not particularly limited, and even if it is rectangular or nonlinear, a mold appropriate for the shape is used.

In the composite wafer according to the present invention, preferably, the supporting substrate is composed of polycrystalline translucent alumina. When it is composed of polycrystalline translucent alumina, the tan δ is small, furthermore, the total light transmittance from the front at a wavelength of 200 to 250 nm is likely to meet the numerical range described above, and the linear transmittance is also likely to meet the numerical range described above.

A method for manufacturing a composite wafer according to the present invention comprises a step of;

(1) a step of bonding a supporting substrate composed of a polycrystalline translucent ceramic, in which the total light transmittance from the front at a wavelength of 200 to 250 nm is higher than the total light transmittance from the front at a wavelength of 555 nm, and a semiconductor substrate composed of silicon to each other by direct bonding; and (2) a step of thinning the semiconductor substrate by subjecting a surface thereof to an ion implantation method or grinding.

According to this method, the composite wafer of the present invention described above can be easily obtained.

In the method for manufacturing a composite wafer according to the present invention, in step (1), a polycrystalline translucent ceramic is used. Such a translucent ceramic can be obtained, for example, by a method in which a slurry containing ceramic powder, a gelling agent, and a gelling catalyst is poured into a mold and solidified to form a formed body, and then the formed body is released from the mold and sintered in a hydrogen atmosphere. The sintering temperature is preferably set at 1,700° C. to 1,800° C. Thereby, the average crystal grain size can be set to 10 μm or more, and the total light transmittance from the front of the translucent ceramic at a wavelength of 200 to 250 nm can be set to be higher than the total light transmittance from the front at a wavelength of 555 nm. When it is desired to further increase the total light transmittance from the front, the crystal grain size is increased. In order to obtain a large crystal grain size, the firing temperature may be increased, or firing may be repeated at the same temperature. By using such a translucent ceramic, good insulation performance ($>10^{14}$ Ωm) and high thermal conduction (e.g., >30 W/mk) can be secured. Furthermore, the tan δ is small, which is suitable for a high frequency device. Furthermore, accuracy of patterning by photolithography is improved.

In the method for manufacturing a composite wafer according to the present invention, in step (1), a supporting substrate and a semiconductor substrate are bonded to each other by direct bonding. As the direct bonding technique, for example, a surface activated bonding technique can be used, in which by activating a surface by plasma treatment, bonding at normal temperature can be achieved.

In the method for manufacturing a composite wafer according to the present invention, in step (2), after the supporting substrate and the semiconductor substrate are bonded to each other, the semiconductor substrate is thinned by an ion implantation method or grinding. Thereby, it is possible to obtain a composite wafer including a semiconductor substrate having excellent insulation performance. When the semiconductor substrate is thinned by an ion implantation method, ions are implanted into a semiconductor substrate (for example, a bulk Si substrate) in advance, and after the semiconductor substrate is bonded to the supporting substrate, a portion of the semiconductor substrate is mechanically or thermally separated. In the case where it is desired to reduce damage to the semiconductor substrate in the step of thinning the semiconductor substrate, use of grinding, instead of use of an ion implantation method, is preferable. When grinding is employed, good crystallinity of Si can be achieved compared with the case where an ion implantation method is employed. When it is desired to obtain a very thin semiconductor substrate with a thickness of 100 nm or less, use of an ion implantation method, instead of grinding, is preferable. The thickness of the semiconductor substrate is not particularly limited. For example, when it is desired to obtain a complete depletion-type CMOS structure, the thickness is preferably set to about 100 to 300 nm. When it is desired to obtain a partial depletion-type CMOS structure, the thickness is preferably set to about 1 μm or less.

DESCRIPTION OF THE PREFERRED EMBODIMENTS

Figure 1:
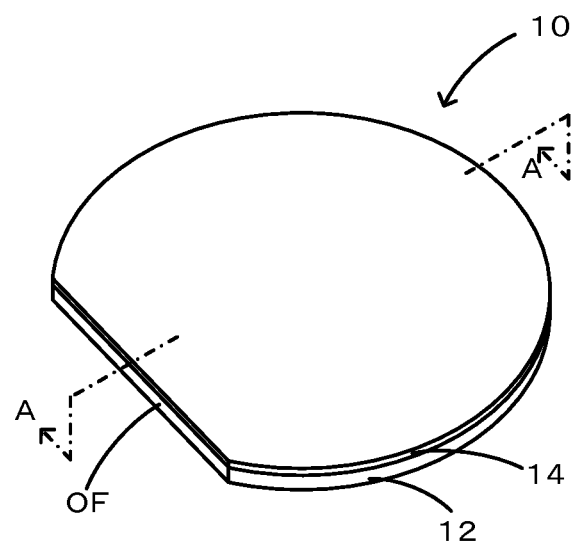
FIG. 1 is a schematic perspective view showing a structure of a composite wafer 10.
Figure 2:
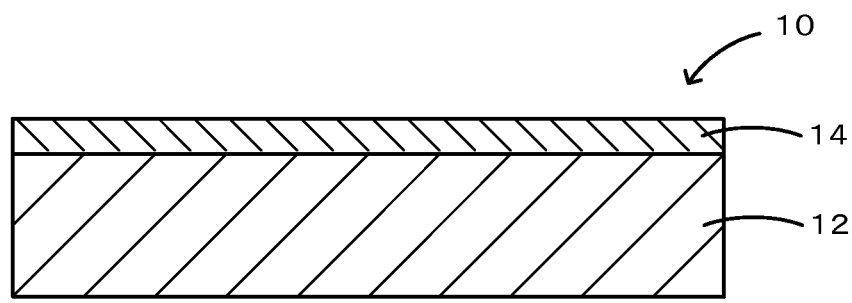
FIG. 2 is a cross-sectional view taken along the line A-A of FIG. 1.

Embodiments of the present invention will be described below with reference to the drawings. FIG. 1 is a schematic perspective view showing a structure of a composite wafer 10 according to an embodiment of the present invention. FIG. 2 is a cross-sectional view taken along the line A-A of FIG. 1.

As shown in FIG. 1, the composite wafer 10 includes a supporting substrate 12 and a semiconductor substrate 14 which are bonded to each other by direct bonding. The composite wafer 10 has a circular shape including a flat portion. The flat portion is referred to as the "orientation flat (OF)" and used for detecting the position and direction of the wafer, for example, when various operations are performed in the semiconductor device fabrication process.

The supporting substrate 12 is a translucent alumina substrate with an alumina purity of 99% or more. The linear transmittance at a wavelength of 200 to 750 nm of the supporting substrate 12 is 20% or less. Furthermore, the total light transmittance from the front at a wavelength of 200 to 250 nm of the supporting substrate 12 is 70% or more, preferably 80% or more, and is higher than the total light transmittance from the front at a wavelength of 555 nm. The average crystal grain size of the supporting substrate 12 is 10 to 50 µm. The arithmetic surface roughness Ra of both surfaces of the supporting substrate 12 is 0.5 to 20 nm. The supporting substrate 12 has a thickness of 50 to 800 µm and is translucent.

The semiconductor substrate 14 is a single crystal silicon substrate. The semiconductor substrate 14 has a thickness of 0.05 to 0.5 µm and is transparent.

Figure 3:
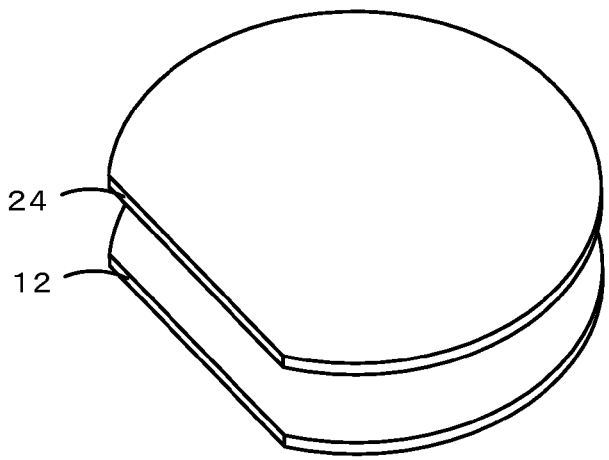
FIG. 3 includes perspective views showing steps of manufacturing a composite wafer 10.
Figure 3:
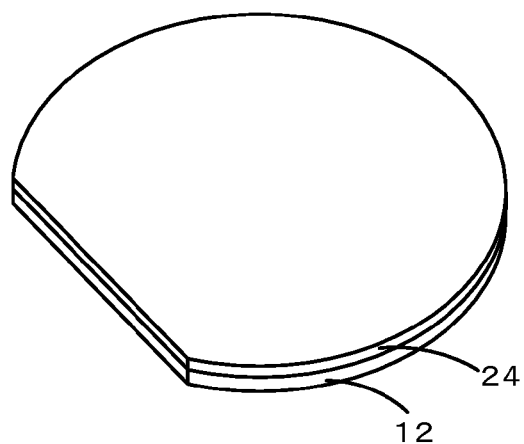
Figure 3:
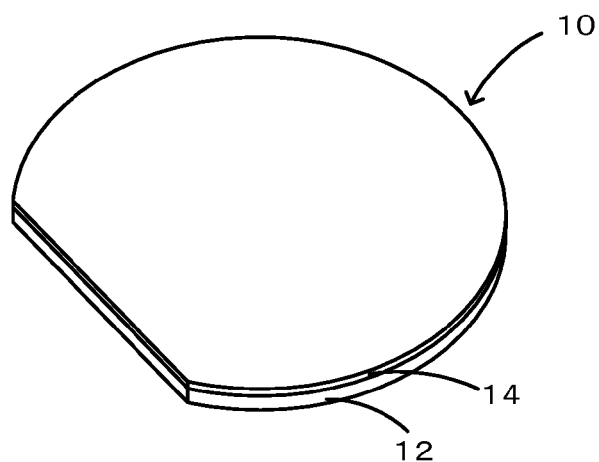

An example of a method for manufacturing such a composite wafer 10 will be described with reference to FIG. 3. FIG. 3 includes perspective views showing steps of manufacturing the composite wafer 10. First, a supporting substrate 12 having an OF and having a predetermined diameter and thickness is prepared. Furthermore, a semiconductor substrate 24 having the same diameter as that of the supporting substrate 12 is prepared (refer to FIG. 3(a)). The semiconductor substrate 24 is thicker than a semiconductor substrate 14 of the composite wafer 10. The supporting substrate 12 is formed, for example, by a gelcasting method. In the gelcasting method, first, a slurry containing α-alumina powder, an isocyanate-based gelling agent, and a catalyst for accelerating urethane reaction is poured into a mold, the slurry is solidified to form a formed body, and then the formed body is released from the mold and sintered in a hydrogen atmosphere to produce polycrystalline translucent alumina. By grinding the resulting polycrystalline translucent alumina, a supporting substrate 12 is obtained. The size of the supporting substrate 12 can be easily increased by using a larger mold in the gelcasting method (for example, to a diameter φ of about 12 inch). In order to increase the average crystal grain size, the firing temperature in the hydrogen atmosphere may be increased, or firing may be repeated at a low firing temperature.

Next, the supporting substrate 12 and the semiconductor substrate 24 are bonded to each other by direct bonding (refer to FIG. 3(b)). As the direct bonding technique, for example, a surface activated bonding technique in which by activating a surface by plasma treatment, bonding at normal temperature can be achieved may be used.

Subsequently, the semiconductor substrate 24 is thinned by an ion implantation method or grinding to a predetermined thickness to obtain a semiconductor substrate 14. Thereby, a composite wafer 10 is obtained (refer to FIG. 3(c)). When the semiconductor substrate is thinned by an ion implantation method, ions are implanted into the semiconductor substrate 24 in advance, and after the semiconductor substrate 24 is bonded to the supporting substrate 12, a portion of the semiconductor substrate 24 is mechanically or thermally separated. In the case where it is desired to reduce damage to the semiconductor substrate 24 in the step of thinning the semiconductor substrate 24, use of grinding is preferable instead of use of an ion implantation method.

The composite wafer 10 thus obtained is then subjected to patterning using a commonly used photolithographic technique. Specifically, a photoresist is applied onto the surface of the semiconductor substrate 14, followed by drying, and the photoresist is irradiated with light through a photomask (mask exposure). Subsequently, the wafer is immersed in a developer to remove an unnecessary photoresist. In the case where the photoresist is a negative resist, portions of the photoresist irradiated with light remain on the semiconductor substrate 14. On the other hand, in the case where the photoresist is a positive resist, portions of the photoresist not irradiated with light remain on the semiconductor substrate 14. In the surface of the semiconductor substrate 14, areas not covered with the photoresist are removed by etching.

During the mask exposure, the irradiated light passes through the semiconductor substrate 14. Since the total light transmittance from the front of the supporting substrate 12 is high, reflection at the bonding interface between the semiconductor substrate 14 and the supporting substrate 12 and from the inside of the supporting substrate 12 backward (i.e., toward the semiconductor substrate) is suppressed. Furthermore, since the linear transmittance of the supporting substrate 12 is low, scattering of light increases inside the supporting substrate 12, and light is prevented from being reflected at the stage surface of an exposure apparatus and exposing the resist on the back side of the mask. In contrast, in the case where the supporting substrate 12 is composed of silicon, since silicon is a single crystal, no grain boundaries are present, and irradiated light may be reflected at the stage surface of an exposure apparatus and may expose the resist on the back side of the mask. Thus, it is not possible to form a pattern with accuracy. Furthermore, in order to form a pattern with high accuracy, it is required to decrease the wavelength of the exposure light source. Accordingly, the supporting substrate 12 preferably scatters light with a shorter wavelength, in particular, light in the short-wavelength ultraviolet region at around 200 nm (e.g., KrF laser (248 nm)). Polycrystalline translucent alumina used for the supporting substrate 12 of this embodiment is characterized in that the total light transmittance from the front improves in such a short-wavelength ultraviolet region, while the linear transmittance decreases. When light is incident on such a supporting substrate 12 made of translucent alumina, the light is refracted at the grain boundaries present inside the supporting substrate 12, and emitted toward all directions. In translucent alumina, this tendency becomes more noticeable as the wavelength of light decreases. Therefore, the linear transmittance decreases, while the total light transmittance from the front improves. That is, as the wavelength decreases, scattered light increases. For this reason, translucent alumina is suitably used, in particular, when exposure and patterning are performed with a short wavelength.

Furthermore, in the wafer process, the composite wafer 10 is automatically transported, and during this process, image recognition is performed using visible light. Accordingly, in order to for the composite wafer 10 to be subjected to image recognition, a property of not transmitting visible light is required. The composite wafer 10 according to this embodiment includes the supporting substrate 12 composed of translucent alumina having a linear transmittance of 20% or less in the wavelength region of 200 to 750 nm, and thus it is suitable for image recognition. In contrast, for example, a SOS (Si-on-Sapphire) wafer includes a supporting substrate composed of sapphire that is transparent in the visible light region, and thus it is not suitable for image recognition.

In the composite wafer 10 according to this embodiment described above in detail, since polycrystalline translucent alumina with a purity of 99% or more is used for the supporting substrate 12, good insulation performance (e.g., >$10^{14}$ Ωm) and thermal conduction (e.g., >30 W/mk) can be secured. Furthermore, since translucent alumina has a small tan δ, it is suitable for a high frequency device. Furthermore, accuracy of patterning by photolithography is improved.

Furthermore, since the average crystal grain size of the supporting substrate 12 is small at 10 to 50 μm, light is likely to be scattered in the exposure step of the photolithographic technique.

Furthermore, the total light transmittance from the front at a wavelength of 200 to 250 nm of the supporting substrate 12 is 70% or more (preferably 80% or more). Therefore, when UV with a wavelength of 200 to 250 nm is used in the exposure step of the photolithography technique, high-accuracy patterning can be performed. That is, UV with a wavelength of 200 to 250 nm passes through the semiconductor substrate. However, in the supporting substrate, since the total light transmittance from the front is high at 70% or more, the amount of scattering and reflection backward, i.e., toward the semiconductor substrate side, is small, and the photoresist on the supporting substrate is scarcely exposed from the back side thereof. Consequently, high-accuracy patterning can be achieved. Incidentally, since the resolution of an exposure apparatus is defined by k×λ/NA (k: coefficient, λ: a wavelength of a light source, NA: a numerical aperture of a projection lens), a fine pattern can be formed by performing exposure with a short wavelength.

Furthermore, since the linear transmittance at a wavelength of 200 to 750 nm of the supporting substrate 12 is 20% or less, the influence due to reflection at the stage surface of an exposure apparatus can be suppressed. Furthermore, when the composite wafer 10 is automatically transported in the semiconductor fabrication process, image recognition can be performed using visible light.

It is to be understood that the present invention is not limited to the embodiment described above, and various modifications are possible within the technical scope of the present invention.

Figure 6:
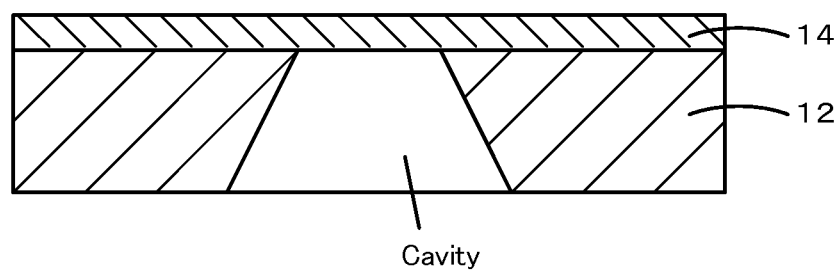
FIG. 6 is a cross-sectional view of a composite wafer according to another embodiment.
Figure 7:
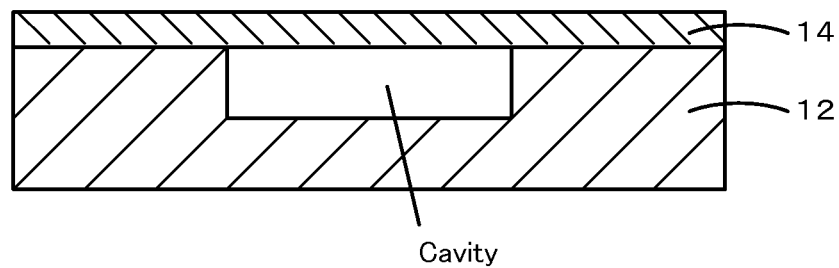
FIG. 7 is a cross-sectional view of a composite wafer according to another embodiment.

For example, in the embodiment described above, the supporting substrate 12 may be provided with a cavity, such as the one shown in FIG. 6 or 7. These composite wafers can be applied to Si-MEMS. The supporting substrate 12 is obtained by forming materials for translucent alumina into a predetermined shape, followed by firing. Accordingly, when a supporting substrate 12 provided with a cavity is formed, a mold by which a formed body provided with a cavity can be obtained is used. Consequently, masking and etching steps are not required. For example, in the case where a silicon substrate, not a translucent alumina substrate, is used as the supporting substrate 12, a series of steps are required to form a cavity in the silicon substrate, which include, first, covering one surface (a surface opposite the surface that is to be bonded to a semiconductor substrate) of the silicon substrate with a mask, exposing/developing the mask, and then etching portions not covered with the mask. The shape of the cavity is not particularly limited, and even if it is rectangular or nonlinear, a mold appropriate for the shape is used.

EXAMPLE

Example 1

First of all, a translucent alumina substrate used as a supporting substrate was prepared by the process described below. First, a slurry was prepared in which components shown in Table 1 were mixed. The α-alumina powder used had a purity of 99.99%, a specific surface of 3.5 to 4.5 m$^2$/g, and an average primary particle size of 0.35 to 0.45 μm.

|  | Components | Part by weight |
|---|---|---|
| Raw material powder | Al$_2$O$_3$ (α-alumina powder) | 100 |
|  | MgO (Magnesia) | 0.050 |
|  | ZrO$_2$ (zirconia) | 0.040 |
|  | Y$_2$O$_3$ (yttria) | 0.0030 |
| Disperse medium | Dimethyl glutarate | 27 |
|  | Ethylene glycol | 0.3 |
| Gelling agent | MDI resin | 4 |
| Dispersant | High molecular surface-active agent | 3 |
| Catalyst | N,N-Dimethylamino hexanol | 0.1 |

Figure 4:
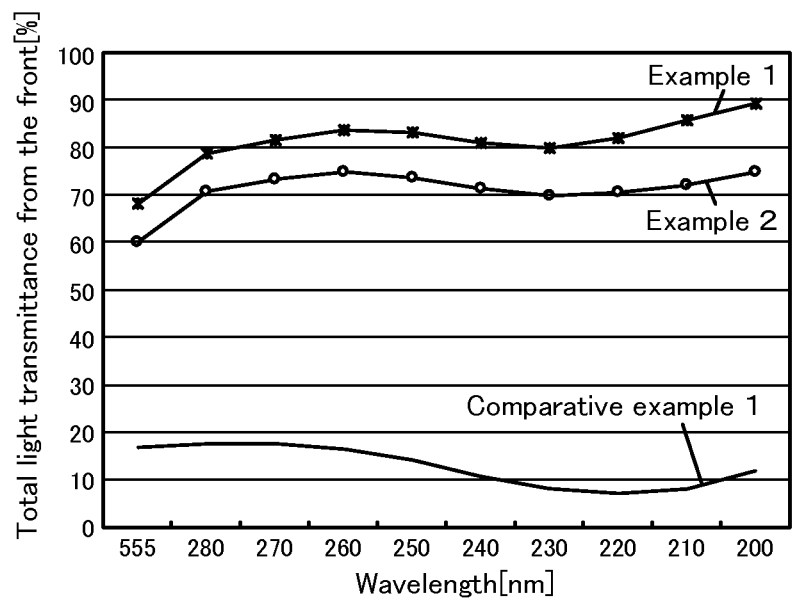
FIG. 4 is a graph showing spectra of total light transmittance from the front of translucent alumina ceramics used in examples and a comparative example.

The slurry was poured into a mold made of an aluminum alloy at room temperature and then left standing at room temperature for one hour. Next, it was left standing at 40° C. for 30 minutes to cause solidification to proceed and then released from the mold. Furthermore, the solidified slurry was left standing at room temperature and at 90° C., each for 2 hours, and thereby, a plate-shaped powder formed body was obtained. The resulting powder formed body was calcined (preliminarily fired) in air at 1,100° C. Then, the calcined body was placed on a plate made of molybdenum, and a plate made of molybdenum was placed thereon. In that state, firing was performed once in an atmosphere of hydrogen:nitrogen=3:1 (volume ratio), at a temperature of 1,750° C., with the rate of temperature rise being 50° C./h from 1,400° C. to 1,600° C. Thereby, a translucent alumina ceramic substrate having an orientation flat and having a diameter φ of 4 inch was obtained. The resulting substrate had a thickness of 1 mm and an average grain size on the surface was 20 μm. The total light transmittance from the front was measured on the translucent alumina substrate without grinding the surface. The results thereof are shown in FIG. 4. As is evident from FIG. 4, the total light transmittance from the front was less than 70% at the visible light wavelength (measurement wavelength: 555 nm), but was high at 80% or more at a wavelength of 200 to 250 nm.

Figure 5:
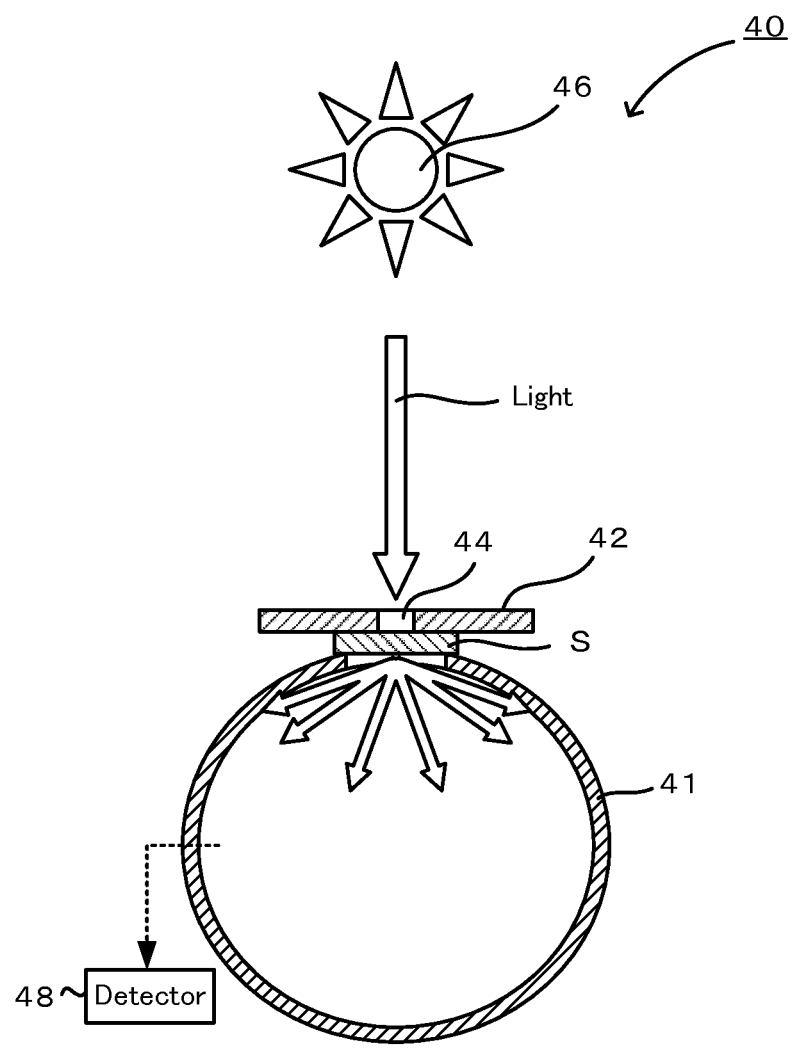
FIG. 5 is a diagram illustrating a measurement device 40.

The total light transmittance from the front was calculated on the basis of measured values obtained by a measurement device 40 shown in FIG. 5. In the measurement device shown in FIG. 5, an opening of an integrating sphere 41 is covered with a sample S (thickness: 3 mm), and a plate 42 having a hole 44 (diameter φ: 3 mm) is placed on the upper surface of the sample S. In that state, light from a light source 46 is made to be incident on the sample S through the hole 44. The light passed though the sample S is collected using the integrating sphere 41, and the intensity of light is measured with a detector 48. The total light transmittance from the front was calculated in accordance to the formula:

Total light transmittance from the front=100×(intensity of light measured)/(intensity of light source).

The resulting polycrystalline translucent alumina substrate was ground to a thickness of 0.6 mm using GC (green carbon) abrasive grains, diamond abrasive grains, and a CMP liquid in that order. The linear transmittance in the visible light range of the substrate was measured to be 20% (measurement wavelength: 555 nm). Furthermore, the tan δ was $10^{-5}$, the volume resistivity was $10^{14}$ Ωm, the thermal conductivity was 33 W/mK, and the arithmetic average roughness Ra was <1 nm.

Next, a single crystal Si substrate with a diameter φ of 4 inch and a thickness of 250 μm having an orientation flat was prepared. The single crystal Si substrate and the polycrystalline translucent alumina substrate described above were bonded together by plasma-activated direct bonding. The two substrates used for bonding were subjected to plasma treatment with nitrogen, followed by water washing treatment to remove particles on the surfaces. The two substrates were aligned on the basis of the orientation flats and overlaid on each other. By bringing the ends of the two substrates into close contact with each other under pressure, the portions subjected to pressure were bonded to each other, and at the same time, the bonding spread to the whole surface. This phenomenon, in which bonding of two substrates proceeds automatically by means of mutually attracting forces (intersurface attraction), is observed when surfaces are very smoothly ground. After bonding of the two substrates was completed, the single crystal Si substrate side was ground, using a grinder, to a thickness of 20 μm. Next, lapping was performed using 1 μm diamond abrasive grains and a tin platen until the thickness became 3 μm. Then, polishing was performed using colloidal silica and a urethane pad so as to achieve a thickness of 0.2 μm. After thinning the Si substrate in such a manner, annealing treatment was performed at 900° C. Thereby, a composite wafer was obtained.

A fine line pattern was formed, using an exposure apparatus, on the Si substrate of the composite wafer obtained as described above. That is, first, a resist was applied onto the Si substrate, and exposure was performed using a mask having a pattern with a line width of 0.4 μm, followed by development. In the exposure, a KrF laser (λ=248 nm) was used. When the translucent alumina substrate was used as a base, light, in particular, around 200 nm, is mostly scattered inside the substrate, and therefore, the influence of light reflected back from the back surface of the wafer is small. Thus, it became possible to form a pattern with high accuracy.

Example 2

Using the slurry employed for producing the polycrystalline translucent alumina substrate of Example 1, a polycrystalline translucent alumina substrate was produced by the same procedure as that of Example 1 except that firing was performed once at a firing temperature of 1,700° C. The total light transmittance from the front was measured on the resulting polycrystalline translucent alumina substrate without grinding the surface. As shown in FIG. 4, the total light transmittance from the front was less than 70% at the visible light wavelength (measurement wavelength: 555 nm), but was high at 70% or more at a wavelength of 200 to 250 nm. The average grain size of the translucent alumina substrate was 12 μm. The translucent alumina substrate was ground to a thickness of 0.6 mm as in Example 1. The linear transmittance in the visible light range of the substrate was measured to be 30% (measurement wavelength: 555 nm). Furthermore, the tan δ was $10^{-5}$, the volume resistivity was $10^{14}$ Ωm, the thermal conductivity was 33 W/mK, and the arithmetic average roughness Ra was 1 nm. Using the translucent alumina substrate subjected to grinding, a composite wafer was fabricated as in Example 1, and a fine line pattern was formed. As a result, it was possible to form a pattern with high accuracy as in Example 1.

Comparative Example 1

Using the slurry employed for producing the polycrystalline translucent alumina substrate of Example 1, a polycrystalline translucent alumina substrate was produced by the same procedure as that of Example 1 except that firing was performed once in a hydrogen atmosphere with the firing temperature being changed to 1,500° C. The total light transmittance from the front was measured on the resulting polycrystalline translucent alumina substrate without grinding the surface. The total light transmittance from the front was 25% at the visible light wavelength (measurement wavelength: 555 nm), but was lower than that at a wavelength of 200 to 250 nm. The total light transmittance from the front at 200 nm to 2 μm of the translucent alumina substrate was 40% or less, and the average grain size was 5 μm. The translucent alumina substrate was ground to a thickness of 0.6 mm as in Example 1. The linear transmittance in the visible light range of the substrate was measured to be 40% (measurement wavelength: 555 nm). Furthermore, the tan δ was $10^{-5}$, the volume resistivity was $10^{14}$ Ωm, the thermal conductivity was 33 W/mK, and the arithmetic average roughness Ra was <1 nm. Using the translucent alumina substrate subjected to grinding, a composite wafer was fabricated as in Example 1, and a fine line pattern was formed. As a result, the laser beam passed through the inside of the substrate, and reflection was caused at the end face. Consequently, the accuracy of the patterned shape was degraded.

The present application claims priority from U.S. Provisional Patent Application No. 61/672807 filed on Jul. 18, 2012, the entire contents of which are incorporated herein by reference.

INDUSTRIAL APPLICABILITY

The composite wafer of the present invention can be applied to a semiconductor device, such as a CMOS.

REFERENCE SIGNS LIST 10 composite wafer, 12 supporting substrate, 1 semiconductor substrate, 24 semiconductor substrate, 40 measurement device, 41 integrating sphere, 42 plate, 44 hole, 46 light source, 48 detector

What is claimed is:

1. A composite wafer comprising a supporting substrate and a semiconductor substrate which are bonded to each other by direct bonding,
   wherein the supporting substrate is composed of a polycrystalline translucent ceramic,
   the semiconductor substrate is composed of silicon, and
   the total light transmittance from the front at a wavelength of 200 to 250 nm of the supporting substrate is higher than the total light transmittance from the front at a wavelength of 555 nm.

2. The composite wafer according to claim 1, wherein the total light transmittance from the front at a wavelength of 200 to 250 nm of the supporting substrate is 80% or more.

3. The composite wafer according to claim 1, wherein the linear transmittance at a wavelength of 200 to 750 nm of the supporting substrate is 20% or less.

4. The composite wafer according to claim 1, wherein the average crystal grain size of the supporting substrate is 10 to 50 μm.

5. The composite wafer according to claim 1, wherein the supporting substrate is provided with a cavity.

6. The composite wafer according to claim 1, wherein the supporting substrate is composed of polycrystalline translucent alumina.

7. The composite wafer according to claim 1, wherein the semiconductor substrate is composed of single crystal silicon.

8. A method for manufacturing a composite wafer comprising:
  (1) a step of bonding a supporting substrate composed of a polycrystalline translucent ceramic, in which the total light transmittance from the front at a wavelength of 200 to 250 nm is higher than the total light transmittance from the front at a wavelength of 555 nm, and a semiconductor substrate composed of silicon to each other by direct bonding; and
  (2) a step of thinning the semiconductor substrate by subjecting a surface thereof to an ion implantation method or grinding.

9. A composite wafer comprising a supporting substrate and a semiconductor substrate which are bonded to each other by direct bonding,
  wherein the supporting substrate is composed of a polycrystalline translucent ceramic,
  the semiconductor substrate is composed of silicon,
  the total light transmittance from the front at a wavelength of 200 to 250 nm of the supporting substrate is higher than the total light transmittance from the front at a wavelength of 555 nm,
  the total light transmittance from the front at a wavelength of 200 to 250 nm of the supporting substrate is 70% or more,
  the linear transmittance at a wavelength of 200 to 750 nm of the supporting substrate is 30% or less,
  the average crystal grain size of the supporting substrate is 10 to 50 µm,
  the supporting substrate is composed of polycrystalline translucent alumina, and
  the semiconductor substrate is composed of single crystal silicon.

* * * * *